(12) United States Patent
Chaudhari et al.

(10) Patent No.: US 10,749,547 B2
(45) Date of Patent: Aug. 18, 2020

(54) ERROR DETECTOR AND/OR CORRECTOR CHECKER METHOD AND APPARATUS

(71) Applicant: Intel Corporation, Santa Clara, CA (US)

(72) Inventors: Prashant D. Chaudhari, Folsom, CA (US); Michael N. Derr, El Dorado Hills, CA (US); Gustavo P. Espinosa, Portland, OR (US); Daren J. Schmidt, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 57 days.

(21) Appl. No.: 15/938,505

(22) Filed: Mar. 28, 2018

(65) Prior Publication Data

US 2019/0052286 A1   Feb. 14, 2019

(51) Int. Cl.
| | | |
|---|---|---|
| H03M 13/01 | (2006.01) | |
| G06F 11/10 | (2006.01) | |
| B60W 50/02 | (2012.01) | |
| G06F 11/22 | (2006.01) | |
| H03M 13/05 | (2006.01) | |
| B60W 50/00 | (2006.01) | |
| G11C 29/52 | (2006.01) | |
| G11C 29/04 | (2006.01) | |

(52) U.S. Cl.
CPC ...... *H03M 13/015* (2013.01); *B60W 50/0205* (2013.01); *G06F 11/10* (2013.01); *G06F 11/1068* (2013.01); *G06F 11/2215* (2013.01); *H03M 13/05* (2013.01); *B60W 2050/0005* (2013.01); *B60W 2050/021* (2013.01); *G11C 29/52* (2013.01); *G11C 2029/0411* (2013.01)

(58) Field of Classification Search
CPC ..... H03M 13/015; H03M 13/05; G06F 11/10; G06F 11/2215; G06F 11/1068; G11C 2029/0411; G11C 29/52; B60W 2050/021; B60W 2050/0005; B60W 50/0205
USPC .......................................................... 714/763
See application file for complete search history.

(56) References Cited

U.S. PATENT DOCUMENTS

| | | | | |
|---|---|---|---|---|
| 6,598,200 | B1 * | 7/2003 | Greenwood | .......... H03M 13/05 |
| | | | | 714/774 |
| 6,775,799 | B1 * | 8/2004 | Giorgetta | .............. H03M 13/35 |
| | | | | 714/704 |
| 8,055,977 | B2 * | 11/2011 | Ito | ....................... G11B 20/1803 |
| | | | | 714/758 |

(Continued)

*Primary Examiner* — James C Kerveros
(74) *Attorney, Agent, or Firm* — Schwabe, Williamson & Wyatt, P.C.

(57) ABSTRACT

In embodiments, an apparatus may comprise random access memory (RAM); an error detecting and/or correcting code (EDCC) encoder to generate and add an error detecting and/or correcting code to a datum being written into the memory for storage; and an EDCC decoder to use the error detecting and/or correcting code added to the datum to correct one or more bits of error in the datum when the datum with the added error detecting and/or correcting code is read back from the RAM. Further, the apparatus may include an error detection and/or correction checker to inject one or more bits of error into the datum when the datum with the added error and/or correcting code is read back from the RAM, and check whether the EDCC decoder is able to correct the one or more bits of error injected into the datum.

24 Claims, 4 Drawing Sheets

(56) References Cited

U.S. PATENT DOCUMENTS

| | | | | |
|---|---|---|---|---|
| 8,352,809 B2* | 1/2013 | Kabulepa | H04L 1/0061 | |
| | | | 714/703 | |
| 8,972,835 B1* | 3/2015 | Rahul | H03M 13/19 | |
| | | | 714/800 | |
| 2002/0026616 A1* | 2/2002 | Kikuchi | G11B 27/3027 | |
| | | | 714/752 | |
| 2012/0096330 A1* | 4/2012 | Przybylski | G06F 11/1072 | |
| | | | 714/763 | |
| 2012/0290899 A1* | 11/2012 | Cideciyan | G06F 11/1072 | |
| | | | 714/773 | |
| 2013/0283108 A1* | 10/2013 | Kono | H04L 43/50 | |
| | | | 714/712 | |

* cited by examiner

ERROR DETECTOR AND/OR CORRECTOR CHECKER METHOD AND APPARATUS

TECHNICAL FIELD

The present disclosure relates to the fields of computing, reliability and safety, in particular, to the reliable and safe operation of mission critical systems, such as in-vehicle systems in automated driving vehicles. More specifically, the present disclosure relates to error detector and/or corrector checker methods and apparatuses.

BACKGROUND

The background description provided herein is for the purpose of generally presenting the context of the disclosure. Unless otherwise indicated herein, the materials described in this section are not prior art to the claims in this application and are not admitted to be prior art by inclusion in this section.

For mission critical systems like automated driving vehicles, it is a requirement to monitor and report errors so that appropriate corrective action can be taken. It is also even more critically beneficial to have errors detected and reported earlier (as compared to error/fault discovery during real time operation/mission).

It is a challenge at real time for functional safety and associated system error monitor to detect and react to numerous errors across all of the system-on-chips (SOC) in a mission critical system, such as an in-vehicle system in an automated driving vehicle, in an efficient and low latency manner. Typically, each SoC (e.g., a display engine, a graphics processor, and so forth) of a mission critical system may comprise a number of devices and memories inside. Further, the memories would have their respective error detection and/or correction hardware. However, an error/fault on the error detection and/or correction hardware itself can miss an error, e.g., a memory error. The possibility of fault on error detection and/or correction creates Functional Safety risk for these mission critical systems, like an in-vehicle system in an autonomous driving vehicle.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
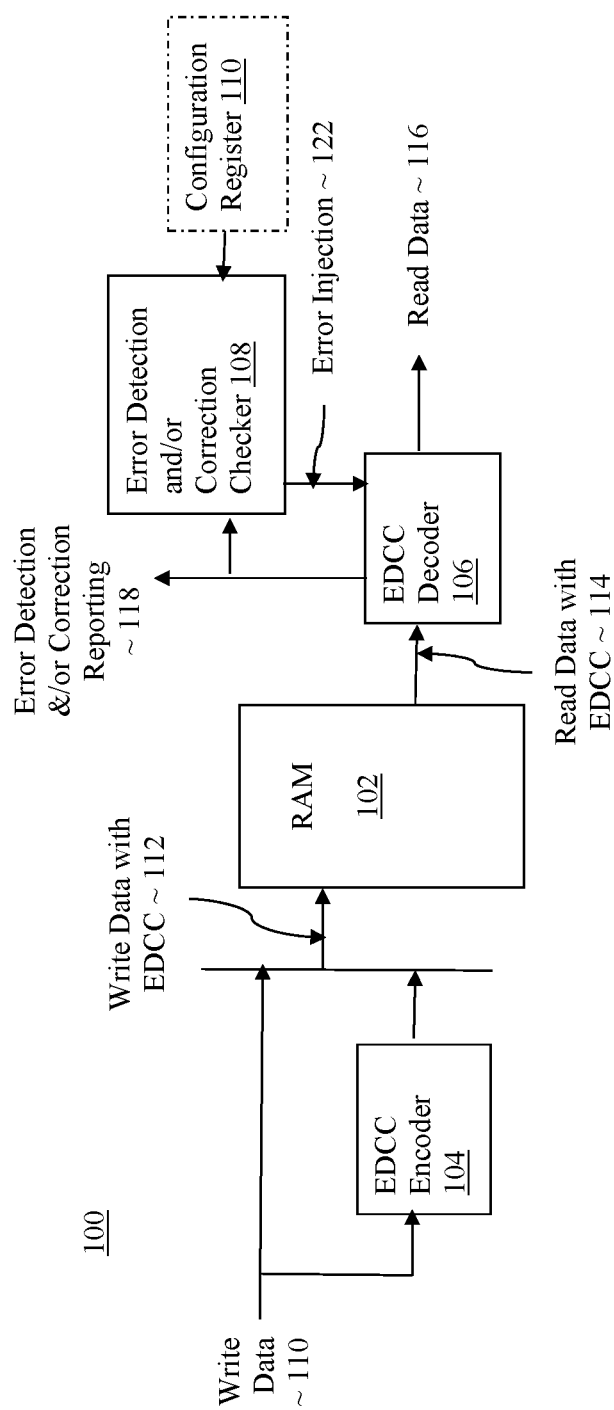
FIG. 1 illustrates an overview of a memory arrangement within a SOC having the error detector and/or corrector checker of the present disclosure, in accordance with various embodiments.

The present disclosure presents error detector and/or corrector checker methods and apparatuses for SOCs included in mission critical systems, such as in-vehicle systems in automated driving vehicles. Prior art systems may include error detection and/or correction circuitry, but do not include checker circuitry to ensure, in real time, the error detection and/or correction circuitry are functioning properly.

In embodiments, an apparatus may comprise random access memory (RAM); an error detecting and/or correcting code (EDCC) encoder coupled to the RAM to generate and add an error detecting and/or correcting code to a datum being written into the memory for storage; and an EDCC decoder coupled to the RAM to use the error detecting and/or correcting code added to the datum to detect and/or correct one or more bits of error in the datum when the datum with the added error detecting and/or correcting code is read back from the RAM. Further, the apparatus may include an error detector and/or corrector checker coupled to the EDCC decoder to inject one or more bits of error into the datum when the datum with the added error detecting and/or correcting code is read back from the RAM, and check whether the EDCC decoder is able to detect and/or correct the one or more bits of error injected into the datum.

In embodiments, the error detector and/or corrector checker may check the EDCC decoder when a system having the apparatus is being booted into operation, at a configured time interval during operation of the system, or during shut down of the system.

In embodiments, the apparatus may be a memory arrangement within a SOC. In embodiments, the SOC may be an SOC in a mission critical system, such as an SOC in an in-vehicle system of an automated driving vehicle. Examples of such an SOC may include but are not limited to a display engine or a graphics processor of the in-vehicle system of the automated driving vehicle.

In the description to follow, reference is made to the accompanying drawings, which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Operations of various methods may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiments. Various additional operations may be performed and/or described operations may be omitted, split or combined in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C). For example, the phrase "detecting and/or correcting" means to cover any one of the scenarios of "detecting only," "detecting and correcting," or "correcting only."

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used hereinafter, including the claims, the terms "interface" and "engine" may refer to, be part of, or include an Application Specific Integrated Circuit (ASIC), an electronic circuit, a programmable combinational logic circuit (e.g., field programmable gate arrays (FPGA)), a processor (shared or dedicate) and/or memory (shared or dedicated) that execute a plurality of programming instructions of one or more software or firmware programs to provide the described functionality.

Referring now to FIG. 1, wherein an overview of a memory arrangement within a SOC having the error detector and/or corrector checker of the present disclosure, in accordance with various embodiments, is illustrated. As shown, for the illustrated embodiments, memory arrangement 100 within a SOC may include random access memory (RAM) 102, EDCC encoder 104, EDCC decoder 106 and error detector and/or corrector (EDC) checker 108. RAM 102 may include a number of memory cells for storing data. EDCC encoder 104 may be coupled to RAM 102 and configured to generate and add an error detecting and/or correcting code to a datum 110 being written into the memory for storage. EDCC decoder 106 may be coupled to RAM 102 to use the error detecting and/or correcting code added to the datum to detect and/or correct one or more bits of error in the datum 114 when datum 114 with the added error detecting and/or correcting code is read back from RAM 102 to produce read data 116. Error detections and/or corrections 118 by EDCC decoder 106 may be reported to e.g., a service or management block of the SOC having memory arrangement 100. EDC checker 108 may be coupled to the EDCC decoder 106 to inject one or more bits of error into the datum 114 when datum 114 with the added error detecting and/or correcting code is read back from the RAM to produce read data 116, and check whether EDCC decoder 106 is able to detect and/or correct the one or more bits of error injected into datum 114.

In embodiments, RAM 102 may be any random access memory capable of storing data, known in the art. Similarly, EDCC encoder 104 may any one of such elements known in the art. The error detection and/or correction code generated by EDCC encoder 104 and added to a datum 110 being written into RAM 102 for storage, may be any one of a number of error detection and/or correction codes known in the art. Examples of error detection and/or correction codes known in the art may include but are not limited to, a repetition code, one or more parity bits, a checksum, or a cyclic redundancy check code, or a hash value.

EDCC decoder 106 may be additionally configured with port(s) and/or circuitry for EDC checker 108 to inject errors into a datum (with added EDCC) being read back from RAM 102, to check whether EDCC decoder 106 is able to properly detect (and/or correct) the error as expected. Except for the additional port(s) and/or circuitry for EDC checker 108 to inject errors into a datum (with added EDCC) being read back from RAM 102, EDCC decoder 106 may be any one of a number of complementary elements to EDCC encoder 104 known in the art.

EDC checker 108 may be configured to inject, during operation of the system having memory arrangement 100, all or selected types of errors into multiple ones of the data (with added EDCC) being read back from RAM 102 to check whether EDCC decoder 106 is detecting and/or correcting errors as expected. EDC checker 108 may check the reporting of error detections and/or corrections 118 by EDCC decoder 106 to determine whether EDCC decoder 106 is detecting and/or correcting errors as expected. On detecting EDCC decoder 106 is not detecting and/or correcting errors as expected, EDC checker 108 may report the failures, e.g., to an administrator or operator, or a system management controller to take corrective actions, if any. Examples of corrective actions may include, but are not limited to, resetting or shutting down portions of memory management 100, entire memory management 100, the SOC or even the entire system having memory arrangement 100. In embodiments, EDC checker 108 may be configured to automatically reset or shut down portions of memory management 100, entire memory management 100, a SOC or even an entire system having memory arrangement 100, on detecting EDCC decoder 106 not detecting and/or correcting errors as expected. The corrective actions may be application dependent, vary from systems to systems.

EDC checker 108 may be configured to inject the errors and check to confirm that EDCC decoder 106 is operating properly in detecting (and/or correcting) the errors as expected, when a system having a SOC incorporated with memory arrangement 100 is being booted into operation, at a configured time interval during operation of the system, or during shut down of the system. The errors may be injected into data 114 being read out in a random or deterministic manner. Likewise, the type of errors injected may be random or in a deterministic manner. In embodiments, the timing, frequencies, and manners in which EDC checker 108 injects errors into data (with EDCC) 114 to check and confirm EDCC decoder 106 is detecting (and/or correcting) error as expected may be statically programed/configured at the time memory arrangement 100 is manufactured, or controlled programmatically via control values programmed into configuration register 110. In embodiments, configuration register 110 may be disposed as part of memory arrangement 100, or outside memory arrangement 100, but as part of the SOC having memory arrangement 100. In still other embodiments, configuration register 110 may be disposed outside the SOC having memory arrangement 100. The operational logic of EDC checker 108 will be further described below with references to FIG. 2.

In embodiments, EDC checker 108 may be implemented with an ASIC, or a programmable circuit (such as a FPGA). In alternate embodiments, EDC checker 108 may be implemented with a microcontroller having firmware and/or software embedded therein to cause EDC checker 108 to perform the functions as described, in response to execution of the embedded firmware and/or software by the microcontroller.

Figure 2:
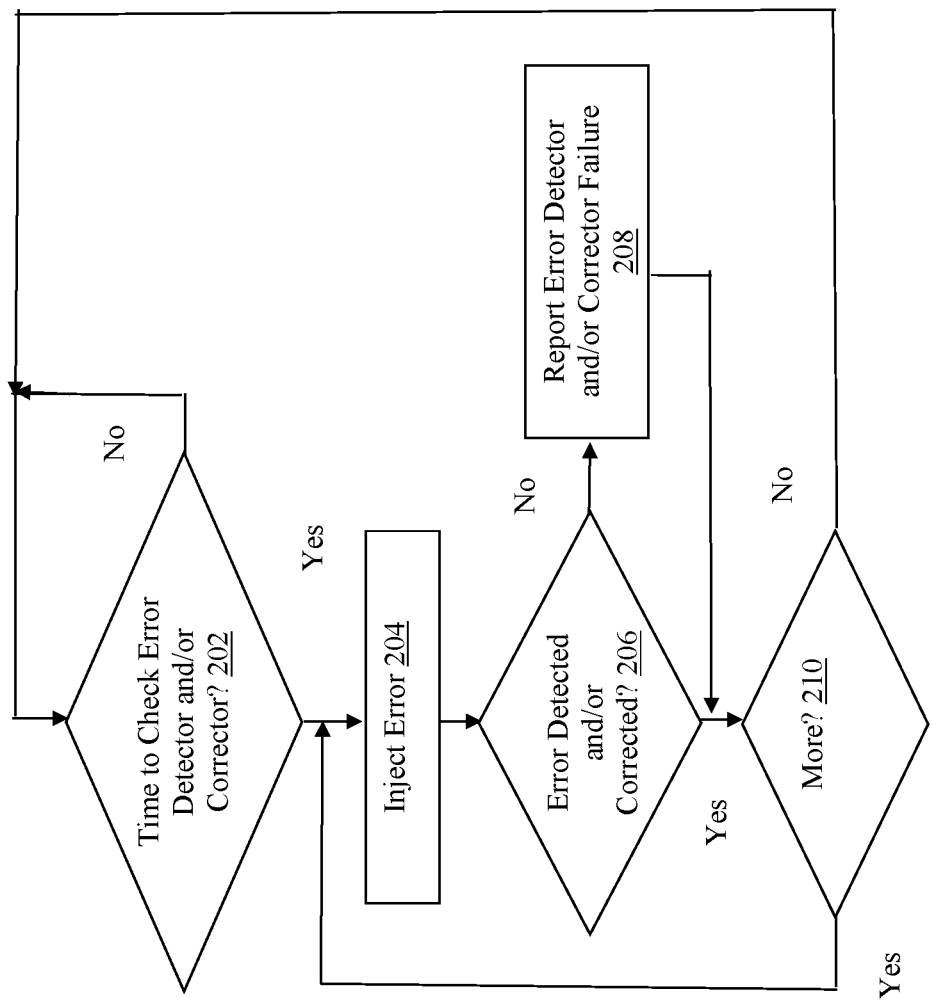
FIG. 2 illustrates an overview of an error detection and/or correction checking process of the present disclosure, in accordance with various embodiments.

Referring now to FIG. 2, wherein an overview of an error detection and/or correction checking process of the present disclosure, in accordance with various embodiments, is illustrated. As shown, for the illustrated embodiments, error detection and/or correction checking process 200 may comprise operations performed at blocks 202-210. In embodiments, the operations may be performed by EDC checker 108 of FIG. 1. In alternate embodiments, process 200 may include more or less operations, and in other embodiments, some of the operations may be split or combined.

Process 200 may start at block 202. At block 202, a determination may be made as to whether it is time to check an error detector and/or corrector (such as an EDCC decoder) for proper functioning, that is whether the error detector and/or corrector is detecting (and/or correcting) errors as expected. Recall in various embodiments, error detection and/or correction checking may be performed when a system having the memory arrangement with the EDC checker is being booted into operation, at a configured time interval during operation of the system, or during shut down of the system. Thus, the determination at block 202 may comprise determining whether the system having the memory arrangement with the EDC checker is being booted into operation, whether the current time is one of the configured time intervals during operation of the system to perform checking, or whether the system is being shut down.

If a result of the determination at block 202 is negative ("No"), i.e., it is not time to check and confirm the proper functioning of an error detector and/or corrector (such as an EDCC decoder), process 200 may remain at block 202, and continually check for the time to check and confirm the proper functioning of the error detector and/or corrector. Eventually, the result of the determination at block 202 is affirmative ("Yes"), i.e., it is time to check and confirm the proper functioning of error detector and/or corrector, process 200 may proceed to block 204. At block 204, errors may be injected into the data being read out of the memory arrangement. As described earlier, both types and which data to receive the error injections may be in accordance with a configuration statically set at manufacturing time, or in accordance with a programmed configuration.

Next at block 206, a determination may be made on whether the error detector and/or corrector reported the error detection (and correction), e.g., by checking whether the error detector and/or corrector reported the detection and/or correction of the error injected. If the determination is negative ("No"), i.e., the error detector and/or corrector failed to report the detection (and correction) of the injected error, at block 208, the failure may be reported. The reporting of the failure may include information about the injected error that facilitate the discovery of the improper functioning of the error detector and/or corrector. In embodiments, as described earlier, additional preventive and/or corrective actions, beyond reporting or in lieu of reporting, may be taken.

From block 206, if the determination is affirmative ("Yes"), i.e., the error detector and/or corrector properly reported the detection (and correction) of the injected error, or from block 208, on reporting of the failure of error detector and/or corrector or taken of preventive/corrective actions, process may proceed to block 210.

At block 210, a determination may be made as to whether there are more errors to be injected for the current round of error injections to check the error detector and/or corrector. If a result of the determination is affirmative ("Yes"), process 200 may return to block 204, and continue therefrom as earlier described. If a result of the determination is negative "No"), process 200 may return to block 202, and continue therefrom as earlier described.

Figure 3:
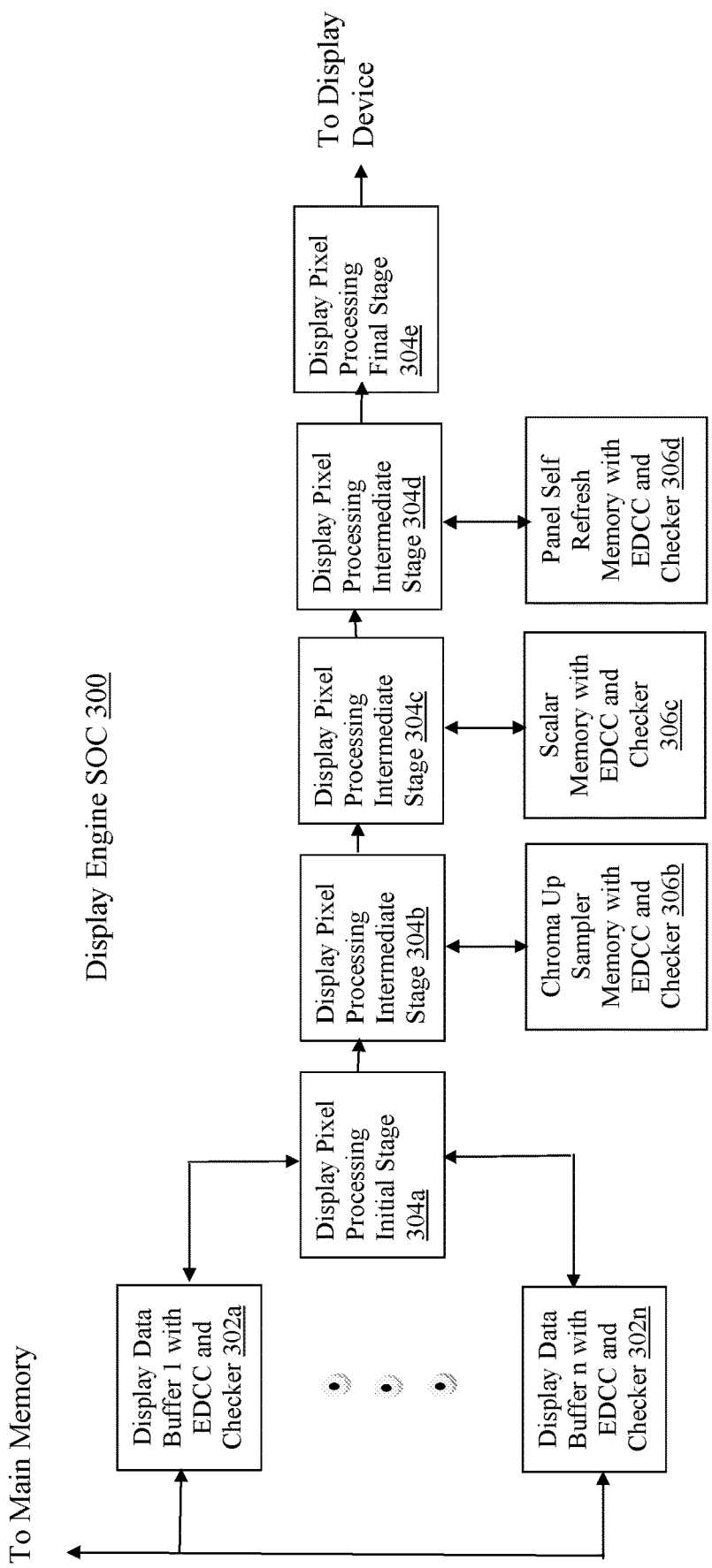
FIG. 3 illustrate an example SOC having memories with the error detector and/or corrector checker of the present disclosure, in accordance with various embodiments.

Referring now to FIG. 3, wherein an example SOC having memories with the EDC checker of the present disclosure, in accordance with various embodiments, is illustrated. As shown, for the illustrated display engine SOC embodiment, i.e., a display engine SOC of an in-vehicle system of an automated driving vehicle, may include a number of display data buffers, 1 through n, 302a-302n, a number of display pixel processing stages 304a-304e, and a number memory arrangements 306b-306d associated with some of the display pixel processing stages 304b-304d. More specifically, for the illustrated embodiments, the display pixel processing stages 304a-304e include a display pixel processing initial stage 304a, three display pixel processing intermediate stages 304b-304d, a display pixel processing final stage 304e. The three display pixel processing intermediate stages 304b-304d may be associated with chroma up sampler processing, scalar processing and panel self refresh processing. Accordingly, the three display pixel processing intermediate stages 304b-304d are respectively associated with memory arrangements 306b-306d, which may be chroma up sampler memory arrangement 306b, scalar memory arrangement 306c, and panel self refresh memory arrangement 306d.

Each of display data buffers 1-n, 302a-302n, and memory arrangements 306b-306d include the EDCC encoder and decoder as well as the EDC checker as earlier described with reference to FIG. 1, thus ensuring the included EDCC decoder is properly operating to detect (and correct) errors, if such errors occur.

During operation, data may be transferred into all or selected ones of display data bufffer 1-n, 302a-302n. The data may be read out and processed successively through the display pixel processing stages 304a-304e. As the data are processed successively through the display pixel processing stages 304a-304e, chroma up sampler processing related data may be stored and read out of memory arrangement 306b, scalar processing related data may be stored and read out of memory arrangement 306c, and panel self refresh processing related data may be stored and read out of memory arrangement 306d. During the operation, the EDC checkers respectively embedded in display data buffers 1-n, 302a-302n, and memory arrangements 306b-306d would check and ensure the respective EDCC decoders would be operating properly, reporting detection (and/or correction) of errors as expected.

At the end of the processing, display pixel processing final stage 304e may output the processed data to a display device of the in-vehicle system.

Figure 4:
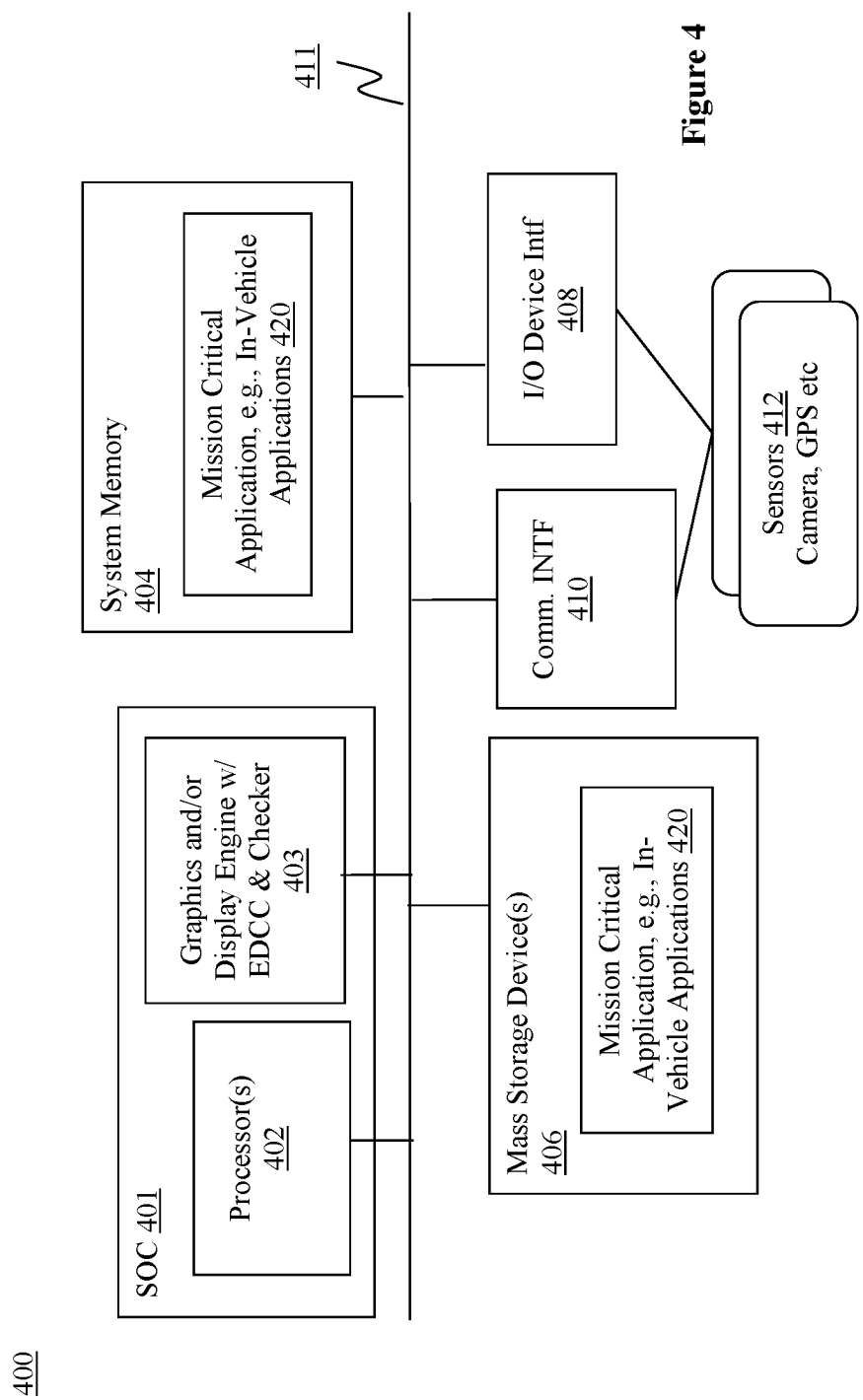
FIG. 4 illustrates an example mission critical system having SOCs incorporated with memories with the error detection and/or correction checker of the present disclosure, in accordance with various embodiments.

Referring now to FIG. 4, wherein an example mission critical system having SOCs incorporated with memories with the EDC checker of the present disclosure, in accordance with various embodiments, is illustrated. As shown, in embodiments, mission critical system 400, which may be an in-vehicle system, may include SOC 401 and system memory 404. SOC 401 may include one or more processors 402 and graphics and/or display engine 402. Each processor 402 may include one or more processor cores. Graphics and/or display engine 403 may be the display engine 300 of FIG. 3, with memory arrangements respectively having EDCC encoders, EDCC decoders, and EDC checkers, as earlier described with references to FIGS. 1-3. System memory 404 may include any known volatile or non-volatile memory. In embodiments, system memory 404 may likewise include one or more EDCC encoders, EDCC decoders, and EDC checkers, as earlier described with references to FIGS. 1-3. Additionally, system 400 may include mass storage device(s) 406 (such as solid state drives), input/output device interface 408 (to interface with e.g., display devices, cameras, sensors, GPS 412), and communication interfaces 410 (such as serial interface, near field communication, network interface cards, modems and so forth). The elements may be coupled to each other via system bus 411, which may represent one or more buses. In the case of multiple buses, they may be bridged by one or more bus bridges (not shown).

Each of these elements may perform its conventional functions known in the art. In particular, memory 404 and mass storage device(s) 406 may be employed to store a working copy and a permanent copy of the executable code of the programming instructions 420 implementing the mission critical applications, such as in-vehicle applications. The programming instructions may comprise assembler instructions supported by processor(s) 402 or high-level languages, such as, for example, C, that can be compiled into such instructions.

The permanent copy of the executable code of the programming instructions 420 may be placed into permanent mass storage device(s) 406 in the factory, or in the field, through, for example, a distribution medium (not shown), such as a compact disc (CD), or through communication interface 410 (from a distribution server (not shown)).

Except for the system 400 having memory arrangements incorporated with EDCC decoder checker of the present disclosure, the constitutions of the elements 410-412 are otherwise known, and accordingly will not be further described.

Thus, methods and apparatuses for checking an error detector and/or corrector to ensure they are detecting (and/or correcting) errors as expected, have been described. Example embodiments described include, but are not limited to, Example 1 may be an apparatus, comprising: random access memory (RAM); an error detecting or correcting code (EDCC) encoder coupled to the RAM to generate and add an error detecting or correcting code to a datum being written into the RAM for storage; an EDCC decoder coupled to the RAM to use the error detecting or correcting code added to the datum to detect or correct one or more bits of error in the datum when the datum with the added error detecting or correcting code is read back from the RAM; and an error detection or correction checker coupled to the EDCC decoder to inject one or more bits of error into the datum when the datum with the added error detecting or correcting code is read back from the RAM, and check whether the EDCC decoder is able to detect or correct the one or more bits of error injected into the datum.

Example 2 may be example 1, wherein the EDCC encoder is arranged to generate and add a repetition code, one or more parity bits, a checksum, or a cyclic redundancy check code, or a hash value to the datum being written into the RAM for storage, as the error detecting or correcting code.

Example 3 may be example 1, wherein the apparatus having the RAM, the EDCC encoder, the EDCC decoder and the error detection or correction checker is a memory arrangement of an in-vehicle system disposed in a computer-assisted or autonomous driving vehicle.

Example 4 may be example 3, wherein the memory arrangement is a display data buffer of a display engine of the in-vehicle system.

Example 5 may be example 3, the memory arrangement is associated with a display pixel processing stage of a display engine of an in-vehicle system.

Example 6 may be example 5, wherein the memory arrangement is a selected one of a chroma up sampler memory arrangement, a scalar memory arrangement or a panel self-refresh memory arrangement.

Example 7 may be example 5, wherein the display pixel processing stage is a display pixel processing intermediate stage having a first other display pixel processing stage that precedes the display pixel processing intermediate stage, and a second other display pixel processing stage that follows the display pixel processing intermediate stage.

Example 8 may be example 7, further comprising the first other display pixel processing stage, or the second other display pixel processing stage.

Example 9 may be any one of examples 1-8, wherein the error detection or correction checker causes the read back of the datum, injects the one or more bits of error into the datum, and checks whether the EDCC decoder is able to detect or correct the one or more bits of error injected into the datum, when a system having the apparatus is being booted into operation, at a configured time interval during operation of the system, or during shut down of the system.

Example 10 may be example 9, wherein the system is an in-vehicle system.

Example 11 may be a method for operating a system, comprising: receiving by an error detecting or correcting code (EDCC) encoder associated with a memory device of the system, a datum for storage into the memory device; generating and adding, by the EDCC encoder, an EDCC to the datum before storing the datum with the added EDCC into the memory device; reading, by an EDCC decoder, the datum with the added EDCC back from the memory device; using, by the EDCC decoder, the error detecting or correcting code added to the datum to correct one or more bits of error in the datum; and at a selected point in time, causing, by an error detection or correction checker, the datum with the added EDCC be read back from the memory device, injecting, by the error detection or correction checker, one or more bits of error into the datum when the datum with the added error detecting or correcting code is read back from the memory device, and checking, by the error detection or correction checker, whether the EDCC decoder is able to correct the one or more bits of error injected into the datum.

Example 12 may be example 11, wherein generating and adding comprises generating and adding, by the EDCC encoder, a repetition code, one or more parity bits, a checksum, or a cyclic redundancy check code, or a hash value to the datum being written into the RAM for storage, as the error detecting or correcting code.

Example 13 may be example 11 or 12, wherein causing, comprises causing, by the error detection or correction checker, the read back of the datum, injection of the one or more bits of error into the datum, and checking whether the EDCC decoder is able to detect or correct the one or more bits of error injected into the datum, when the system is being booted into operation.

Example 14 may be example 11 or 12, wherein causing, comprises causing, by the error detection or correction checker, the read back of the datum, injection of the one or more bits of error into the datum, and checking whether the EDCC decoder is able to detect or correct the one or more bits of error injected into the datum, at a configured time interval during operation of the system.

Example 15 may be example 11 or 12, wherein causing, comprises causing, by the error detection or correction checker, the read back of the datum, injection of the one or more bits of error into the datum, and checking whether the EDCC decoder is able to detect or correct the one or more bits of error injected into the datum, during shut down of the system.

Example 16 may be a system, comprising: a display engine having one or more display data buffers, and one or more display pixel processing stages having one or more associated memory arrangements; wherein at least one of the one or more display data buffers or one of the one or more associated memory arrangements comprises: random access memory (RAM); an error detecting or correcting code (EDCC) encoder coupled to the RAM to generate and add an error detecting or correcting code to a datum being written into the RAM for storage; an EDCC decoder coupled to the RAM to use the error detecting or correcting code added to the datum to correct one or more bits of error in the datum when the datum with the added error detecting or correcting code is read back from the RAM; and an error detection or correction checker coupled to the EDCC decoder to inject one or more bits of error into the datum when the datum with the added error detecting or correcting code is read back from the RAM, and check whether the EDCC decoder is able to correct the one or more bits of error injected into the datum.

Example 17 may be example 16, wherein the EDCC encoder is arranged to generate and add a repetition code, one or more parity bits, a checksum, or a cyclic redundancy check code, or a hash value to the datum being written into the RAM for storage, as the error detecting or correcting code.

Example 18 may be example 16, wherein at least one of the one or more display data buffers comprises the RAM, the EDCC encoder, the EDCC decoder and the error detection or correction checker.

Example 19 may be example 16, wherein at least one of the one or more associated memory arrangements comprises the RAM, the EDCC encoder, the EDCC decoder and the error detection or correction checker.

Example 20 may be example 19, wherein the one or more display pixel processing stages comprises a display pixel processing intermediate stage and the memory arrangement is a selected one of a chroma up sampler memory arrangement, a scalar memory arrangement or a panel self-refresh memory arrangement.

Example 21 may be any one of examples 16-20, wherein the error detection or correction checker causes the read back of the datum, injects the one or more bits of error into the datum, and checks whether the EDCC decoder is able to detect or correct the one or more bits of error injected into the datum, when the system is being booted into operation.

Example 22 may be any one of examples 16-20, wherein the error detection or correction checker causes the read back of the datum, injects the one or more bits of error into the datum, and checks whether the EDCC decoder is able to detect or correct the one or more bits of error injected into the datum, at a configured time interval during operation of the system.

Example 23 may be any one of examples 16-20, wherein the error detection or correction checker causes the read back of the datum, injects the one or more bits of error into the datum, and checks whether the EDCC decoder is able to detect or correct the one or more bits of error injected into the datum, during shut down of the system.

Example 24 may be any one of examples 16-20, wherein the system is an in-vehicle system. Although certain embodiments have been illustrated and described herein for purposes of description, a wide variety of alternate and/or equivalent embodiments or implementations calculated to achieve the same purposes may be substituted for the embodiments shown and described without departing from the scope of the present disclosure. This application is intended to cover any adaptations or variations of the embodiments discussed herein. Therefore, it is manifestly intended that embodiments described herein be limited only by the claims.

Where the disclosure recites "a" or "a first" element or the equivalent thereof, such disclosure includes one or more such elements, neither requiring nor excluding two or more such elements. Further, ordinal indicators (e.g., first, second or third) for identified elements are used to distinguish between the elements, and do not indicate or imply a required or limited number of such elements, nor do they indicate a particular position or order of such elements unless otherwise specifically stated.

What is claimed is:

1. An apparatus, comprising:
   random access memory (RAM);
   an error detecting or correcting code (EDCC) encoder coupled to the RAM to generate and add an error detecting or correcting code to a datum for storage into the RAM;
   an EDCC decoder coupled to the RAM to use the error detecting or correcting code added to the datum to detect or correct one or more bits of error in the datum when the datum with the added error detecting or correcting code is read back from the RAM into the EDCC decoder, wherein the EDCC decoder is further arranged to report a detection or correction of one or more bits of error in the datum read back from the RAM; and
   an error detection or correction checker coupled to the EDCC decoder, to inject one or more bits of error into the datum when the datum with the added error detecting or correcting code is read back from the RAM into the EDCC decoder, and to check reporting by the EDCC decoder to determine whether the EDCC decoder detects or corrects the one or more bits of error injected by the error detection or correction checker into the datum read back from the RAM into the EDCC decoder correctly.

2. The apparatus of claim 1, wherein the EDCC encoder is arranged to generate and add a repetition code, one or more parity bits, a checksum, or a cyclic redundancy check code, or a hash value to the datum being written into the RAM for storage, as the error detecting or correcting code.

3. The apparatus of claim 1, wherein the apparatus having the RAM, the EDCC encoder, the EDCC decoder and the error detection or correction checker is a memory arrangement of an in-vehicle system disposed in a computer-assisted or autonomous driving vehicle.

4. The apparatus of claim 3, wherein the memory arrangement is a display data buffer of a display engine of the in-vehicle system.

5. The apparatus of claim 3, wherein the memory arrangement is associated with a display pixel processing stage of a display engine of an in-vehicle system.

6. The apparatus of claim 5, wherein the memory arrangement is a selected one of a chroma up sampler memory arrangement, a scalar memory arrangement or a panel self-refresh memory arrangement.

7. The apparatus of claim 5, wherein the display pixel processing stage is a display pixel processing intermediate stage having a first other display pixel processing stage that precedes the display pixel processing intermediate stage, and a second other display pixel processing stage that follows the display pixel processing intermediate stage.

8. The apparatus of claim 7, further comprising the first other display pixel processing stage, or the second other display pixel processing stage.

9. The apparatus of claim 1, wherein the error detection or correction checker causes the read back of the datum from the RAM, injects the one or more bits of error into the datum as the datum is read back from the RAM into the EDCC decoder, and checks the reporting of the EDCC decoder to determine whether the EDCC decoder detects or corrects the one or more bits of error injected by the error detection or correction checker into the datum being read back from the RAM into the EDCC decoder correctly, when a system having the apparatus is being booted into operation, at a configured time interval during operation of the system, or during a shutdown of the system.

10. The apparatus of claim 9, wherein the system is an in-vehicle system.

11. A method for operating a system, comprising:
receiving by an error detecting or correcting code (EDCC) encoder associated with a memory device of the system, a datum for storage into the memory device;
generating and adding, by the EDCC encoder, an EDCC to the datum before storing the datum with the added EDCC into the memory device; and
at a selected point in time, causing, by an error detection or correction checker, the datum with the added EDCC to be read back from the memory device into an EDCC decoder arranged to use the error detecting or correcting code added to the datum to correct one or more bits of error in the datum, and report detection or correction of one or more bits of error in the datum read back from the memory device into the EDCC decoder, injecting, by the error detection or correction checker, one or more bits of error into the datum with the added error detecting or correcting code beingi-s read back from the memory device into the EDCC decoder, and checking, by the error detection or correction checker, reporting by the EDCC decoder to determine whether the EDCC decoder detects or corrects the one or more bits of error injected into the datum being read back from the memory device into the EDCC decoder.

12. The method of claim 11, wherein generating and adding comprises generating and adding, by the EDCC encoder, a repetition code, one or more parity bits, a checksum, or a cyclic redundancy check code, or a hash value to the datum being written into the RAM for storage, as the error detecting or correcting code.

13. The method of claim 11, wherein causing comprises causing, by the error detection or correction checker the read back of the datum from the memory device into the EDCC decoder, injection of the one or more bits of error into the datum read back from the memory device into the EDCC decoder, and checking the reporting of the EDCC decoder to determine whether the EDCC decoder detects or corrects the one or more bits of error injected into the datum being read back from the memory device into the EDCC decoder, when the system is being booted into operation.

14. The method of claim 11, wherein causing comprises causing, by the error detection or correction checker, the read back of the datum from the memory device into the EDCC decoder, injection of the one or more bits of error into the datum being read back from the memory device into the EDCC decoder, and checking the reporting of the EDCC decoder to determine whether the EDCC decoder detects or corrects the one or more bits of error injected into the datum being read back from the memory device into the EDCC decoder, at a configured time interval during operation of the system.

15. The method of claim 11, wherein causing comprises causing, by the error detection or correction checker, the read back of the datum from the memory device into the EDCC decoder, injection of the one or more bits of error into the datum being read back from the memory device into the EDCC decoder, and checking reporting by the EDCC decoder to determine whether the EDCC decoder detects or corrects the one or more bits of error injected into the datum being read back from the memory device into the EDCC decoder, during shutdown of the system.

16. A system, comprising:
a display engine having one or more display data buffers, and one or more display pixel processing stages having one or more associated memory arrangements;
wherein at least one of the one or more display data buffers or one of the one or more associated memory arrangements comprises:
random access memory (RAM);
an error detecting or correcting code (EDCC) encoder coupled to the RAM to generate and add an error detecting or correcting code to a datum for storage into the RAM;
an EDCC decoder coupled to the RAM to use the error detecting or correcting code added to the datum to correct one or more bits of error in the datum when the datum with the added error detecting or correcting code is read back from the RAM into the EDCC decoder, wherein the EDCC decoder is further arranged to report a detection or correction of one or more bits of error in the datum read back from the RAM into the EDCC decoder; and
an error detection or correction checker coupled to the EDCC decoder, to inject one or more bits of error into the datum when the datum with the added error detecting or correcting code is read back from the RAM into the EDCC decoder, and check reporting of the EDCC decoder to determine whether the EDCC decoder detects or corrects the one or more bits of error injected into the datum being read back from the RAM into the EDCC decoder.

17. The system of claim 16, wherein the EDCC encoder is arranged to generate and add a repetition code, one or more parity bits, a checksum, or a cyclic redundancy check code, or a hash value to the datum being written into the RAM for storage, as the error detecting or correcting code.

18. The system of claim 16, wherein at least one of the one or more display data buffers comprises the RAM, the EDCC encoder, the EDCC decoder and the error detection or correction checker.

19. The system of claim 16, wherein at least one of the one or more associated memory arrangements comprises the RAM, the EDCC encoder, the EDCC decoder and the error detection or correction checker.

20. The system of claim 19, wherein the one or more display pixel processing stages comprises a display pixel processing intermediate stage and the memory arrangement is a selected one of a chroma up sampler memory arrangement, a scalar memory arrangement or a panel self-refresh memory arrangement.

21. The system of claim 16, wherein the error detection or correction checker causes the read back of the datum from the RAM into the EDCC decoder, injects the one or more bits of error into the datum being read back from the RAM into the EDCC decoder, and checks the reporting of the EDCC decoder to determine whether the EDCC decoder detects or corrects the one or more bits of error injected into the datum being read back from the RAM into the EDCC decoder, when the system is being booted into operation.

22. The system of claim 16, wherein the error detection or correction checker causes the read back of the datum from the RAM into the EDCC decoder, injects the one or more bits of error into the datum being read back from the RAM into the EDCC decoder, and checks the reporting of the EDCC decoder to determine whether the EDCC decoder detects or corrects the one or more bits of error injected into the datum being read back from the RAM into the EDCC decoder, at a configured time interval during operation of the system.

23. The system of claim 16, wherein the error detection or correction checker causes the read back of the datum from the RAM into the EDCC decoder, injects the one or more bits of error into the datum being read back from the RAM into the EDCC decoder, and checks the reporting of the EDCC decoder to determine whether the EDCC decoder detects or corrects the one or more bits of error injected into the datum being read back from the RAM into the EDCC decoder, during shutdown of the system.

24. The system of claim 16, wherein the system is an in-vehicle system.

* * * * *

UNITED STATES PATENT AND TRADEMARK OFFICE
CERTIFICATE OF CORRECTION

PATENT NO. : 10,749,547 B2  
APPLICATION NO. : 15/938505  
DATED : August 18, 2020  
INVENTOR(S) : Prashant D. Chauhari et al.

Page 1 of 1

It is certified that error appears in the above-identified patent and that said Letters Patent is hereby corrected as shown below:

In the Claims

Column 11  
Line 20, Claim 11 "...beingi-s..." should read – "...being..."

Signed and Sealed this  
Twentieth Day of October, 2020

Andrei Iancu  
*Director of the United States Patent and Trademark Office*